(12) United States Patent
Abdolvand et al.

(10) Patent No.: US 8,350,633 B1
(45) Date of Patent: Jan. 8, 2013

(54) MICROELECTROMECHANICAL RESONATORS WITH PASSIVE FREQUENCY TUNING USING VARIABLE IMPEDANCE CIRCUITS

(75) Inventors: Reza Abdolvand, Stillwater, OK (US); Mohsen Shahmohammadi Ghahsareh, Tulsa, OK (US); Mohammad J. Modarres-Zadeh, Tulsa, OK (US)

(73) Assignee: The Board of Regents for Oklahoma State University, Stillwater, OK (US)

( * ) Notice: Subject to any disclaimer, the term of this patent is extended or adjusted under 35 U.S.C. 154(b) by 39 days.

(21) Appl. No.: 13/175,445

(22) Filed: Jul. 1, 2011

Related U.S. Application Data (60) Provisional application No. 61/393,760, filed on Oct. 15, 2010.

(51) Int. Cl.
H03B 5/32 (2006.01)
H01L 41/047 (2006.01)

(52) U.S. Cl. ....... 331/155; 331/36 R; 331/154; 310/321; 310/366; 310/368

(58) Field of Classification Search .......... 310/321, 310/366, 368; 331/34, 36 C, 36 R, 116 FE, 331/116 M, 116 R, 154–156
See application file for complete search history.

(56) References Cited

U.S. PATENT DOCUMENTS

| | | | |
|---|---|---|---|
| 3,683,213 A * | 8/1972 | Staudte | 310/312 |
| 5,132,643 A * | 7/1992 | Ueno et al. | 331/163 |
| 5,329,256 A * | 7/1994 | Higgins, Jr. | 331/107 A |
| 5,585,770 A * | 12/1996 | Higgins, Jr. | 333/193 |
| 6,320,474 B1 * | 11/2001 | Kamiya et al. | 331/177 V |
| 6,909,221 B2 | 6/2005 | Ayazi et al. | |
| 7,492,241 B2 | 2/2009 | Piazza et al. | |
| 7,639,105 B2 | 12/2009 | Ayazi et al. | |
| 7,791,432 B2 | 9/2010 | Piazza et al. | |
| 7,800,282 B2 | 9/2010 | Ayazi et al. | |
| 7,843,284 B2 | 11/2010 | Ayazi et al. | |
| 7,888,843 B2 | 2/2011 | Ayazi et al. | |
| 7,893,784 B2 * | 2/2011 | Hirama | 331/163 |
| 7,915,974 B2 | 3/2011 | Piazza et al. | |
| 7,924,119 B1 | 4/2011 | Ayazi et al. | |
| 7,939,990 B2 | 5/2011 | Wang et al. | |
| 2006/0273867 A1 | 12/2006 | Piazza et al. | |
| 2006/0290449 A1 | 12/2006 | Piazza et al. | |
| 2009/0072663 A1 * | 3/2009 | Ayazi et al. | 310/320 |

(Continued)

OTHER PUBLICATIONS

Abdolvand R. et al., "Thin-Film Piezoelectric-on-Silicon Resonators for High-Frequency Reference Oscillator Applications", *IEEE Transactions on Ultrasonics, Ferroelectrics, and Frequency Control*, vol. 55, No. 12, Dec. 2008, pp. 2596-2606.

(Continued)

*Primary Examiner* — Levi Gannon
(74) *Attorney, Agent, or Firm* — Myers Bigel Sibley & Sajovec, P.A.

(57) ABSTRACT

Periodic signal generators include an oscillator circuit, which is configured to generate a first periodic signal at an output thereof, and a piezoelectric-based microelectromechanical resonator. The resonator is configured to generate a second periodic signal at a first electrode thereof, which is electrically coupled to the oscillator circuit. A variable impedance circuit is provided, which is electrically coupled to a second electrode of the piezoelectric-based microelectromechanical resonator. The variable impedance circuit is configured to passively modify a frequency of the second periodic signal by changing an induced electromechanical stiffness in at least a portion of the piezoelectric-based microelectromechanical resonator.

21 Claims, 7 Drawing Sheets

U.S. PATENT DOCUMENTS

2009/0108959 A1     4/2009     Piazza et al.
2009/0144963 A1     6/2009     Piazza et al.

OTHER PUBLICATIONS

Kim B. et al., "Capacitive Frequency Tuning of ALN Micromechanical Resonators", *Transducers 2011*, Beijing, China, Jun. 5-9, 2011, pp. 502-505.

Piazza G. et al., "One and Two Port Piezoelectric Contour-Mode MEMS Resonators for Frequency Synthesis", *Proceedings of the 36th European Solid-State Device Research Conference*, pp. 182-185, Sep. 2006.

Piazza G. et al., "Piezoelectric Aluminum Nitride Vibrating Contour-Mode MEMS Resonators", *Journal of Microelectrochemical Systems*, vol. 15, Issue 6, Dec. 2006, pp. 1406-1418.

Samarao et al., "Intrinsic Temperature Compensation of Highly Resistive High-Q Silicon Microresonators via Charge Carrier Depletion", Frequency Control Symposium (FCS), Newport Beach, CA, 2010 IEEE International (Jun. 1-4, 2010), pp. 334-339.

Shahmohammadi M. et al., "Low Jitter Thin-Film Piezoelectric-on-Substrate Oscillators", *Proceedings IEEE International Frequency Control Symposium (IFCS)*, Newport Beach, CA, Jun. 1-4, 2010, pp. 613-617.

Shahmohammadi M. et al., "Passive Tuning in Lateral-Mode Thin-Film Piezoelectric Oscillators", *Proceedings 2011 Joint Conference of the IEEE International Frequency Control Symposium (IFCS 2011) and European Frequency and Time Forum (EFTF)*, San Francisco, CA, May 2011, 5 pages.

\* cited by examiner

MICROELECTROMECHANICAL RESONATORS WITH PASSIVE FREQUENCY TUNING USING VARIABLE IMPEDANCE CIRCUITS

REFERENCE TO PRIORITY APPLICATION

This application claims priority to U.S. Provisional Application Ser. No. 61/393,760, filed Oct. 15, 2010, the disclosure of which is hereby incorporated herein by reference.

FIELD OF THE INVENTION

The present invention relates to integrated circuit devices and, more particularly, to microelectromechanical resonator devices.

BACKGROUND OF THE INVENTION

Frequency references provided by oscillators are required in every clocked electronic system, including communication circuits, microprocessors, and signal processing circuits. Oscillators frequently consist of high performance piezoelectric crystals, such as quartz oscillators. The advantages of quartz oscillators are their stable operating frequency and high quality factor. However, the disadvantages of quartz oscillators are their relatively large size and unsuitability for high integration with electronic circuitry (e.g., CMOS circuits).

Based on these limitations of conventional oscillators, there is a strong interest in the development of fully integrated silicon oscillators. Integration is important not only for reduced size but also reduced power consumption. It is possible to realize an integrated silicon oscillator using the mechanical properties of silicon devices. For example, silicon microelectromechanical (MEMS) resonators can provide small form factor, ease of integration with conventional semiconductor fabrication techniques and high f•Q products. Accordingly, MEMS resonators are considered a desirable alternative to quartz resonators in real-time and other clock applications.

One example of a MEMs resonator includes lateral-mode piezoelectric resonators, such as thin-film piezoelectric-on-silicon (TPoS) resonators, which have been successfully incorporated in low-power and low-noise oscillators. Some examples of these types of resonators are disclosed in U.S. Pat. No. 7,939,990 to Wang et al., entitled "Thin-Film Bulk Acoustic Resonators Having Perforated Bodies That Provide Reduced Susceptibility to Process-Induced Lateral Dimension Variations," and in U.S. Pat. No. 7,888,843 to Ayazi et al., entitled "Thin-Film Piezoelectric-on-Insulator Resonators Having Perforated Resonator Bodies Therein," the disclosures of which are hereby incorporated herein by reference. Unfortunately, frequency tuning has not been studied extensively in these types of resonators.

Active frequency tuning techniques that include application of a DC voltage on the piezoelectric layer have been demonstrated, but such tuning typically requires relatively large voltages, which may be incompatible with the low operating voltages of conventional oscillator circuits. Some examples of active frequency tuning in micromechanical resonators are disclosed in U.S. Pat. Nos. 7,639,105 and 7,843,284 to Ayazi et al., entitled "Lithographically-Defined Multi-Standard Multi-Frequency High-Q Tunable Micromechanical Resonators," and in U.S. Pat. No. 7,924,119 to Ayazi et al., entitled Micromechanical Bulk Acoustic Mode Resonators Having Interdigitated Electrodes and Multiple Pairs of Anchor Supports," and in U.S. Pat. No. 7,800,282 to Ayazi et al., entitled Single-Resonator Dual-Frequency Lateral-Extension Mode Piezoelectric Oscillators, and Operating Methods Thereof," the disclosures of which are hereby incorporated herein by reference. Based on limitations of active frequency tuning, cost effective passive tuning techniques have been considered.

SUMMARY OF THE INVENTION

Periodic signal generators according to embodiments of the invention utilize passively-tuned microelectromechanical resonators. In some of these embodiments, a periodic signal generator is provided with an oscillator circuit, which is configured to generate a first periodic signal at an output thereof. A piezoelectric-based microelectromechanical resonator is also provided. This resonator is configured to generate a second periodic signal at a first electrode thereof, which is electrically coupled to the oscillator circuit. A variable impedance circuit is provided, which is electrically coupled to a second electrode of the piezoelectric-based microelectromechanical resonator. The variable impedance circuit is configured to passively modify a frequency of the second periodic signal by changing an induced electromechanical stiffness in at least a portion of the piezoelectric-based microelectromechanical resonator.

According to some embodiments of the invention, the piezoelectric-based microelectromechanical resonator may be a bulk-lateral-mode microelectromechanical resonator, such as a thin-film piezoelectric-on-semiconductor resonator. The resonator may also include a pair of interdigitated electrodes. A first one of the pair of interdigitated electrodes may include a center finger that is electrically connected to the variable impedance circuit. A second one of the pair of interdigitated electrodes may include a pair of fingers that are spaced on opposing sides of the center finger. The center finger is preferably located over a position of maximum stress within the resonator. The width of the center finger relative to the pair of fingers influences the tuning range of the resonator. According to some preferred embodiments of the invention, a width of the center finger should be at least 1.5 times greater than a width of each of the pair of fingers.

The variable impedance circuit may include a variable capacitance device, such as a varactor diode, and a fixed capacitor connected in series between a first terminal of the varactor diode and the first one of the pair of interdigitated electrodes. A relatively high resistance resistor may also be provided, which has a first terminal electrically connected to the first terminal of the varactor diode and a second terminal configured to receive a reference voltage. The variable impedance circuit is configured to change a voltage across the varactor diode in response to changes in magnitude of the reference voltage. The resonator may further include a piezoelectric layer, which is sandwiched between the pair of interdigitated electrodes and an underlying reference electrode. This reference electrode may be electrically coupled to the oscillator circuit. An inductor may also be provided, which has a first terminal electrically coupled to the first one of the pair of interdigitated electrodes and a second terminal electrically coupled to the reference electrode. Preferably, the inductor has an inductance of sufficient magnitude to cancel out at least a majority of a parasitic capacitance of the thin-film piezoelectric-on-semiconductor resonator, and thereby improve its tuning range.

According to still further embodiments of the invention, a periodic signal generator is provided with a microelectromechanical resonator, an oscillator circuit and a variable impedance circuit. The resonator includes a pair of interdigitated electrodes, a reference electrode and a piezoelectric layer extending between the reference electrode and the pair of interdigitated electrodes. The oscillator circuit is configured to generate a periodic signal at an output thereof. The oscillator circuit has a first terminal/node electrically coupled to a first of the pair of interdigitated electrodes and a second terminal/node electrically coupled to the reference electrode. The variable impedance circuit is electrically coupled to a second of the pair of interdigitated electrodes. The variable impedance circuit is configured to modify an electromechanical stiffness in the piezoelectric layer when the resonator is excited (e.g., in a fundamental lateral-extensional mode of operation). The variable impedance circuit may include a varactor diode and a fixed capacitor electrically connected in series between a first terminal of the varactor diode and the second of the pair of interdigitated electrodes. A performance enhancing inductor may also be provided. This inductor, which has a first terminal electrically coupled to the second of the pair of interdigitated electrodes and a second terminal electrically coupled to the reference electrode, is configured to cancel out parasitic capacitance within the resonator, which would otherwise limit a maximum tuning range of the resonator.

DETAILED DESCRIPTION OF EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element or layer is referred to as being "on," "connected to" or "coupled to" another element or layer (and variants thereof), it can be directly on, connected or coupled to the other element or layer or intervening elements or layers may be present. In contrast, when an element is referred to as being "directly on," "directly connected to" or "directly coupled to" another element or layer (and variants thereof), there are no intervening elements or layers present. Like reference numerals refer to like elements throughout.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Embodiments of the present invention are described herein with reference to cross-section and perspective illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a sharp angle may be somewhat rounded due to manufacturing techniques/tolerances.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
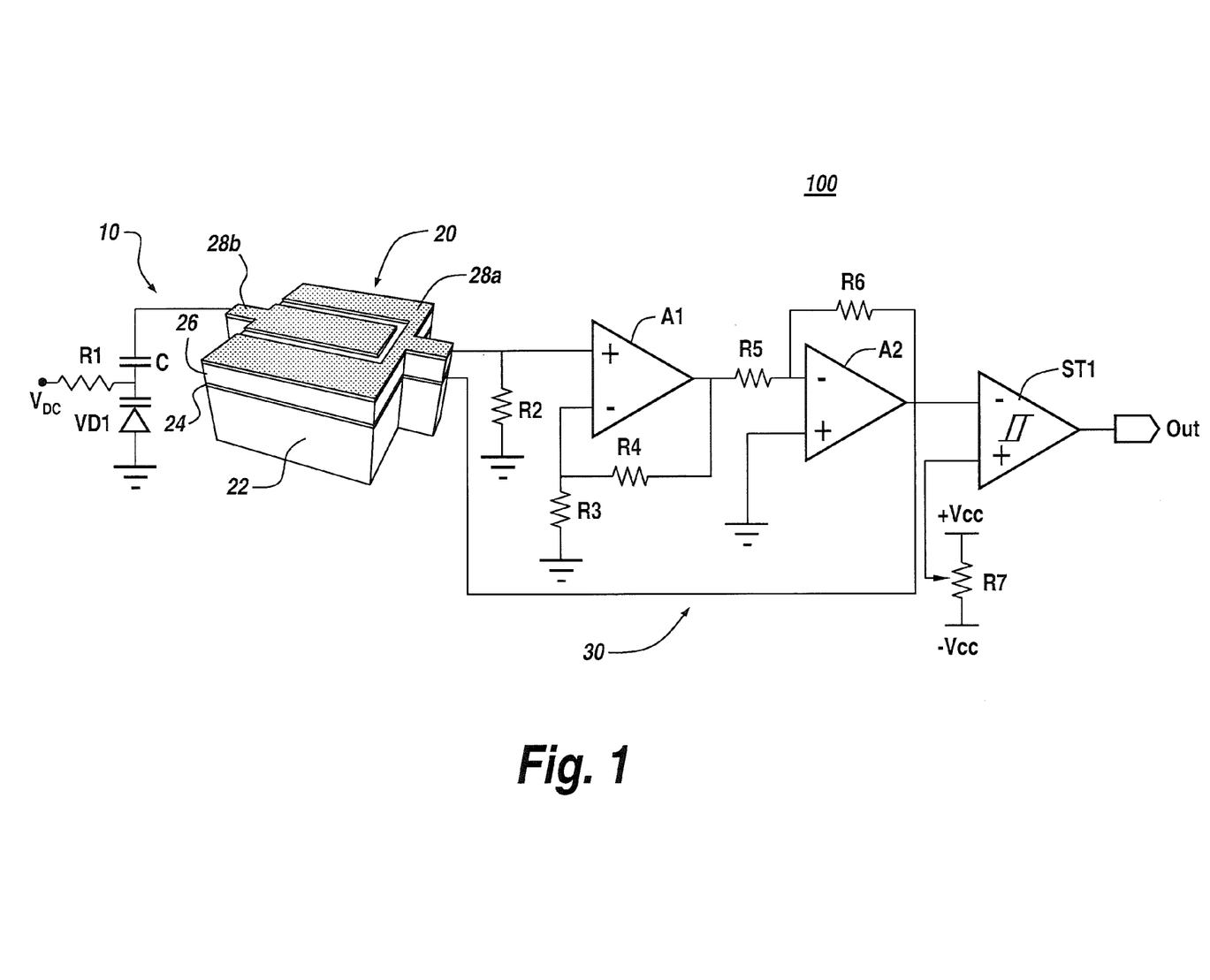
FIG. 1 is an electrical schematic of a periodic signal generator according to an embodiment of the present invention.

FIG. 1 is an electrical schematic of a periodic signal generator 100 according to an embodiment of present invention. This generator 100 is illustrated as including a tunable oscillator circuit 30, a piezoelectric-based microelectromechanical resonator 20, which is shown as a lateral mode thin-film piezoelectric-on-semiconductor (TPoS) resonator, and a variable impedance circuit 10. The oscillator circuit 30 includes two amplification stages within an oscillation loop, which are provided by first operational amplifier A1 and a phase-correcting second operational amplifier A2, and a Schmitt trigger comparator ST1. The comparator ST1 converts an output signal from the second operational amplifier A2 into a square wave output signal that can support jitter measurements. The oscillator circuit 30 further includes resistors R2-R7, connected as illustrated. The variable impedance circuit 10 includes a large capacitor C, a varactor diode VD1, which provides a voltage-controlled variable capacitance, and an input resistor R1, connected as illustrated. The input resistor R1 includes a terminal responsive to a tuning voltage ($V_{DC}$), which controls the magnitude of the capacitance provided by the varactor diode VD1. The large capacitor C, which operates as an AC short circuit for high frequency signals, is connected in series between a cathode of the varactor diode VD1 and a second electrode of the piezoelectric-based microelectromechanical resonator 20. This second electrode is embodied as a center electrode 28b of a pair of interdigitated electrodes 28a, 28b, which are provided on an upper surface of a piezoelectric layer 26. This piezoelectric layer 26 is sandwiched between the interdigitated electrodes 28a, 28b and a bottom reference electrode 24, which may, in some embodiments of the invention, be connected to the output of second operational amplifier A2. The electrode 28a with the pair of fingers on opposing sides of the center electrode 28b is electrically connected to the first operational amplifier A1. The resonator 20 further includes a semiconductor (e.g., silicon) resonator body 22, which can be suspended opposite an opening in a surrounding substrate (not shown). In some embodiments of the invention, the electrodes 24, 28a-28b and the piezoelectric layer 26 may be formed of molybdenum (Mo) and aluminum nitride (AlN), respectively.

Figure 2:
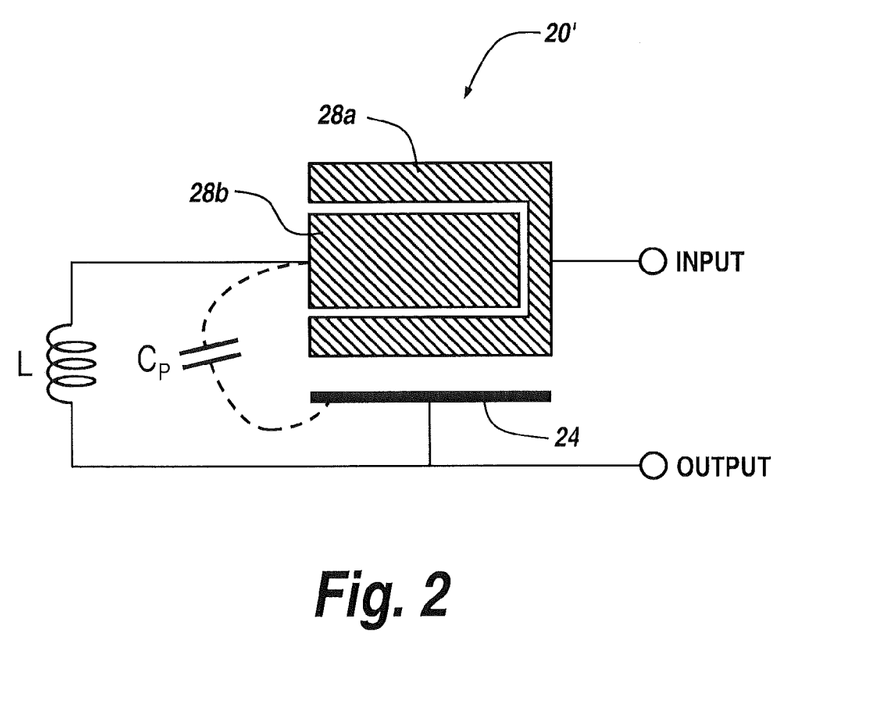
FIG. 2 is an electrical schematic of a piezoelectric-based microelectromechanical resonator that utilizes an inductor to compensate for parasitic capacitance associated with the resonator.

Although not wishing to be bound by any theory, the application of an adjustable tuning voltage $V_{DC}$ to the varactor diode VD1 operates to vary a shunt impedance at a port of the resonator 20. This variation in shunt impedance causes the resonant frequency of the resonator 20 and consequently the frequency of the periodic output signal generated by the second operational amplifier A2 to change in response to changes in the tuning voltage $V_{DC}$. In particular, by separating a tuning port from a signal port, the termination impedance provided by the variable impedance circuit 10 can be altered between extremes (open and short) in order to expand the tuning range of the resonator 20 without significantly adversely affecting the performance of the oscillation loop. This expansion in the tuning range is achieved because the shunt impedance provided by the variable impedance circuit 10 changes the effective modulus of the piezoelectric layer 26, which means the minimum and maximum impedances provided by the variable impedance circuit 10 set the resonance frequency limits of the resonator 20. These frequency limits may be further increased by using the center electrode finger 28b as the tuning port because this electrode finger overlaps a portion of the piezoelectric layer 26 that undergoes the maximum stress in a fundamental mode. In this regard, it is advantageous that a ratio of a width of the center electrode finger 28b to a width of the fingers in the electrode 28a be greater than about 1.5 because the frequency tuning range of the resonator 20 typically increases as this ratio increases. Furthermore, as illustrated at FIG. 2, in order to maintain the frequency tuning range of a microelectromechanical resonator 20' at near its theoretical limits, a parallel inductor L may be added to cancel out at least a majority of a parasitic capacitance $C_P$ at the tuning port, which may be generated by wire bonds and printed circuit board traces. These and other aspects of the periodic signal generator 100 of FIG. 1 are described in an article by M. Shahmohammadi, entitled "Passive Tuning in Lateral-Mode Thin-Film Piezoelectric Oscillators," Proceedings of The International Frequency Control Symposium (IFCS 2011), San Francisco, May 2011, the disclosure of which is hereby incorporated herein by reference.

Figure 3A:
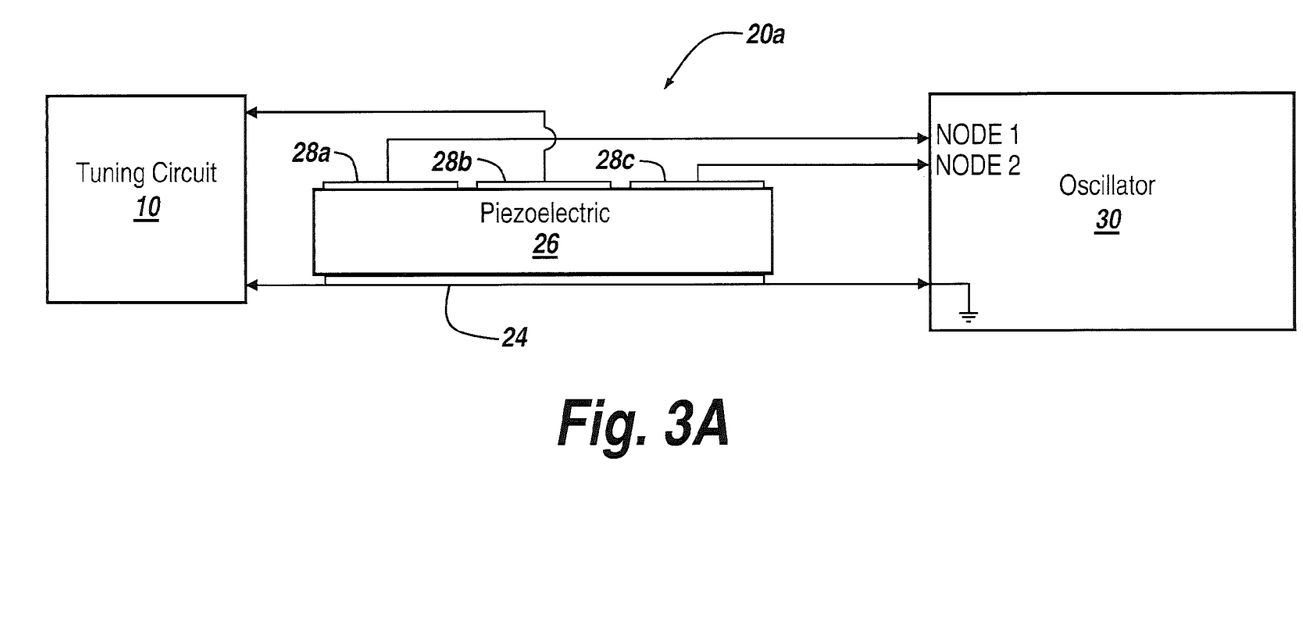
FIG. 3A is a cross-sectional view of an alternative microelectromechanical resonator that may be utilized in the periodic signal generator of FIG. 1.
Figure 3B:
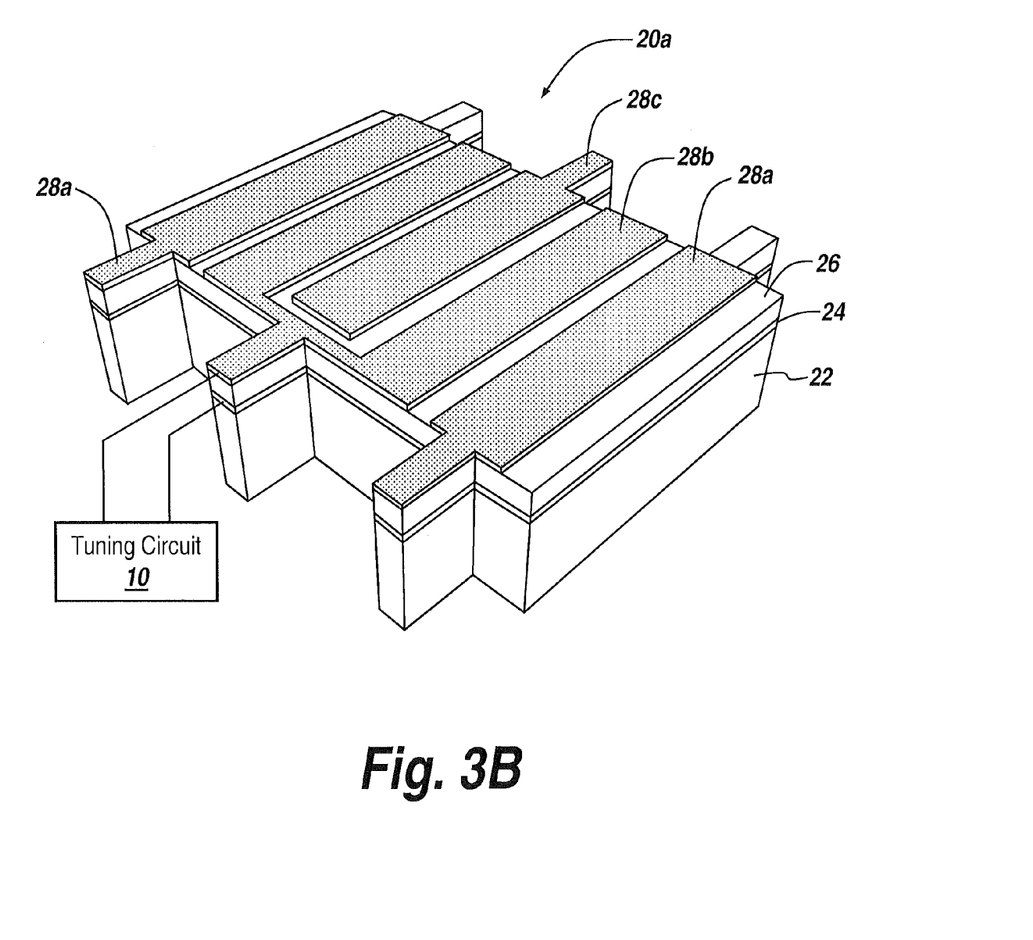
FIG. 3B is a perspective view of an embodiment of a resonator that is similar to the embodiment of FIG. 3A.

FIG. 3A illustrates a cross-sectional view of a pure-piezoelectric resonator 20a that may be utilized in the periodic signal generator of FIG. 1. It can be expected that the tuning range of the resonator 20a of FIG. 3A may be greater than an otherwise equivalent TPoS resonator because the contribution of the piezoelectric modulus of the piezoelectric layer 26 on the overall effective modulus is greater by virtue of the elimination of the underlying resonator body 22. FIG. 3B illustrates a perspective view of a resonator 20a (with resonator body 22) that may be substituted for the resonator 20a of FIG. 3A. As shown by FIGS. 3A-3B, a pair of single-finger electrodes 28a may be connected to a first node of an oscillator circuit 30 and a center-finger electrode 28c may be connected to a second node of the oscillator circuit 30. With reference to the signal generator 100 of FIG. 1, the first node of the oscillator circuit 30 may be embodied as the positive input terminal of the first operational amplifier A1 and the second node of the oscillator circuit 30 may be embodied as the output terminal of the second operational amplifier A2. FIG. 3B further illustrates that a variable impedance tuning circuit 10 may be connected to the two-finger electrode 28b and the bottom reference electrode 24.

Figure 4A:
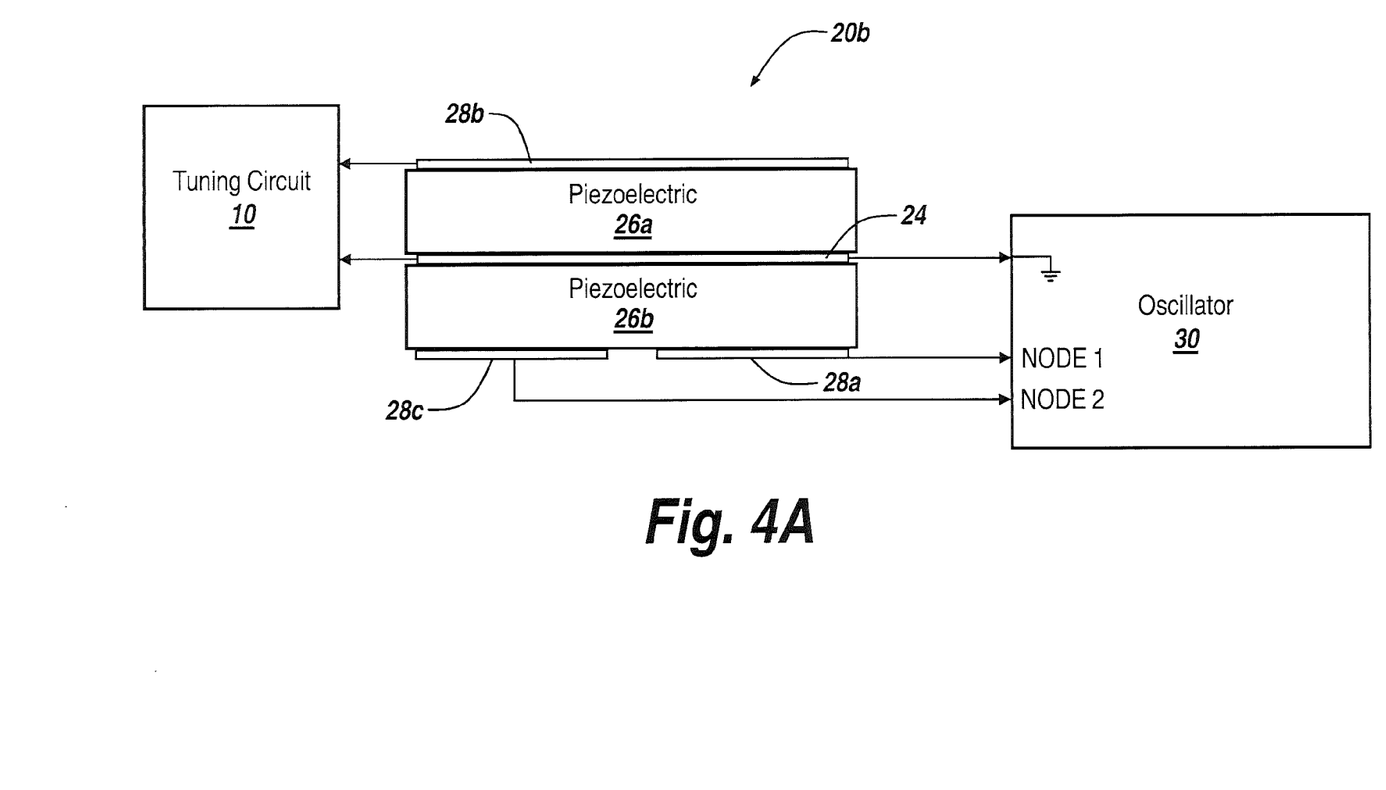
FIG. 4A is a cross-sectional view of an alternative microelectromechanical resonator that may be utilized in the periodic signal generator of FIG. 1.
Figure 4B:
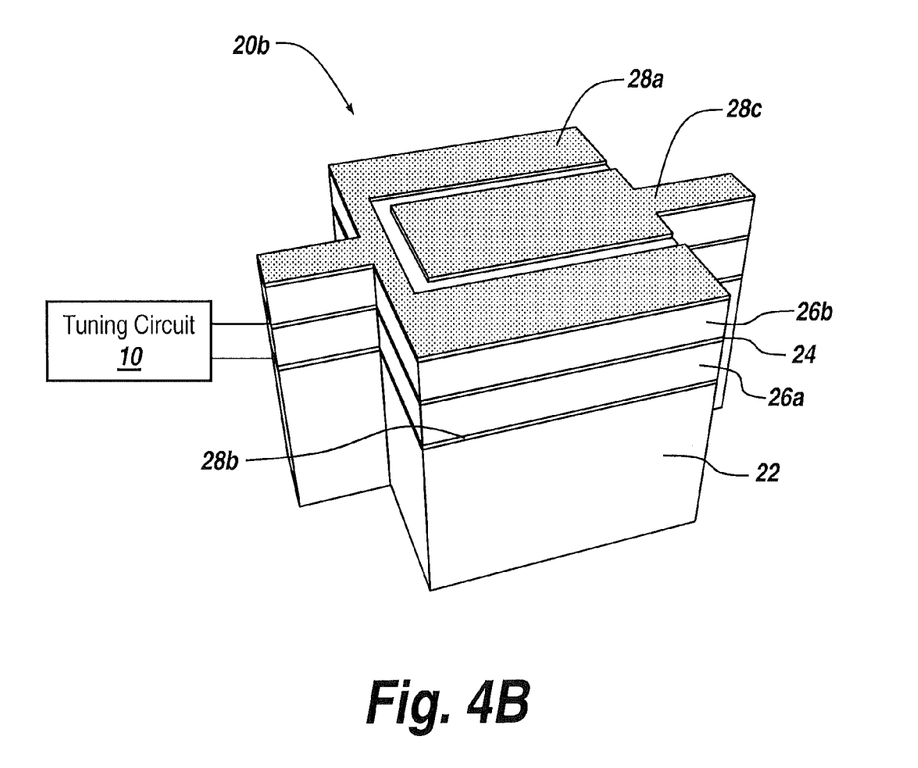
FIG. 4B is a perspective view of an embodiment of a resonator that is similar to the embodiment of FIG. 4A.

FIG. 4A illustrates a cross-sectional view of a pure-piezoelectric resonator 20b that may be utilized in the periodic signal generator of FIG. 1. This resonator 20b includes a dual-stack of piezoelectric layers 26a-26b with an intervening reference electrode 24. FIG. 4B illustrates a perspective view of a resonator 20b (with resonator body 22) that may be substituted for the resonator 20b of FIG. 4A. As shown by FIGS. 4A-4B, a dual-finger electrode 28a may be connected to a first node of an oscillator circuit 30 and a center-finger electrode 28c may be connected to a second node of the oscillator circuit 30. FIG. 4B further illustrates that a variable impedance tuning circuit 10 may be connected to the planar electrode 28b and the reference electrode 24, which is sandwiched between the piezoelectric layers 26a, 26b.

Figure 5:
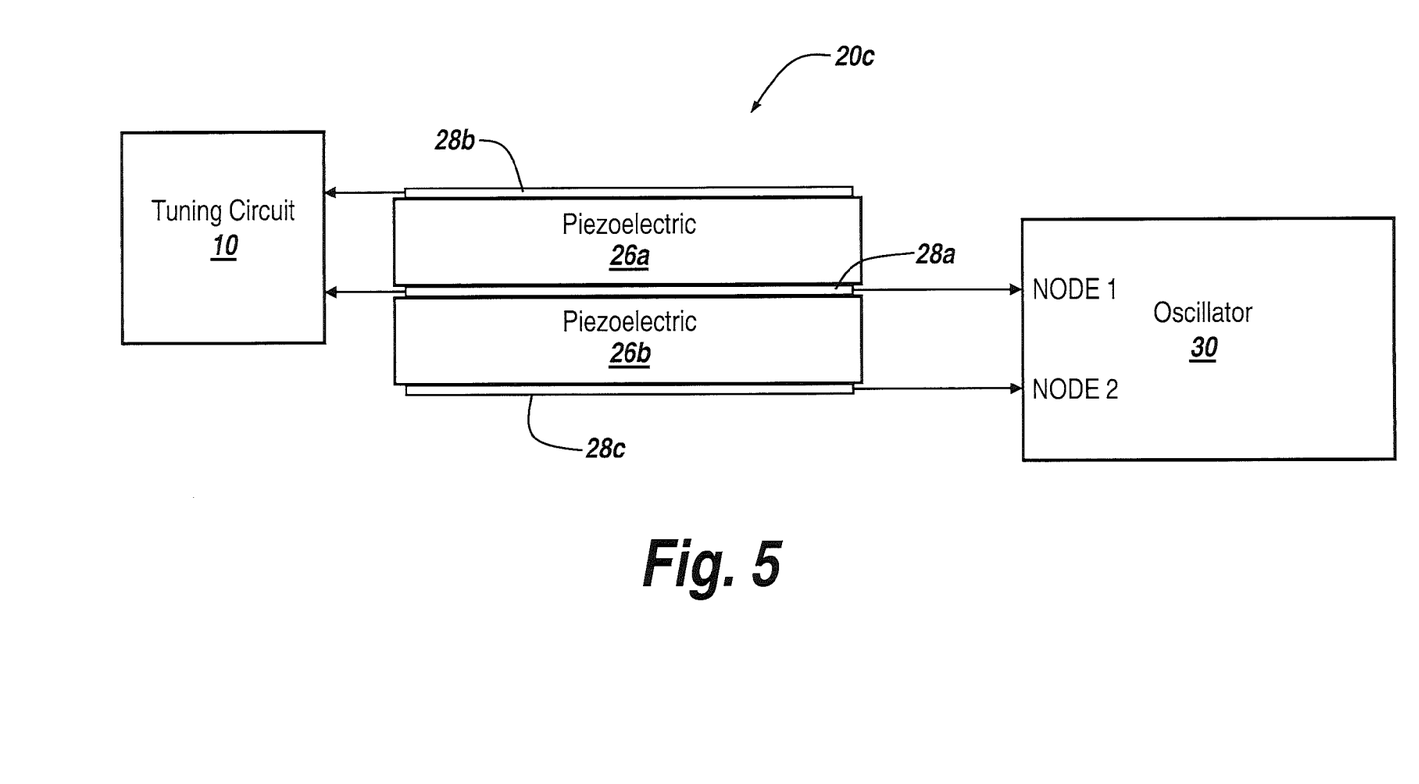
FIG. 5 is a cross-sectional view of an alternative microelectromechanical resonator that may be utilized in the periodic signal generator of FIG. 1.

FIG. 5 illustrates a cross-sectional view of a pure-piezoelectric resonator 20c that may be utilized in the periodic signal generator of FIG. 1. This resonator 20c includes a dual-stack of piezoelectric layers 26a-26b with an intervening middle electrode 28a. This middle electrode 28a and the bottom surface electrode 28c are connected to first and second nodes of the oscillator circuit 30, respectively. In addition, the middle electrode 28a and the upper surface electrode 28b are connected to the tuning circuit.

In the drawings and specification, there have been disclosed typical preferred embodiments of the invention and, although specific terms are employed, they are used in a generic and descriptive sense only and not for purposes of limitation, the scope of the invention being set forth in the following claims.

The invention claimed is:
1. A periodic signal generator, comprising:
an oscillator circuit configured to generate a periodic signal at an output thereof;
a three-terminal piezoelectric-based microelectromechanical resonator having a first electrode electrically coupled to said oscillator circuit and a reference elec- trode that receives, as feedback, a signal generated at a node of said oscillator circuit; and a variable impedance circuit electrically coupled to a second electrode of said piezoelectric-based microelectromechanical resonator, said variable impedance circuit configured to modify a frequency of the periodic signal by changing an induced electromechanical stiffness in at least a portion of said piezoelectric-based microelectromechanical resonator.

2. The generator of claim 1, wherein said piezoelectric-based microelectromechanical resonator comprises a bulk-lateral-mode microelectromechanical resonator.

3. The generator of claim 2, wherein the bulk-lateral-mode microelectromechanical resonator comprises a thin-film piezoelectric resonator.

4. The generator of claim 3, wherein the reference electrode is separated from the first and second electrodes by a piezoelectric layer.

5. The generator of claim 2, wherein the bulk-lateral-mode microelectromechanical resonator comprises a thin-film piezoelectric-on-semiconductor resonator.

6. The generator of claim 5, wherein the reference electrode is separated from the first and second electrodes by a piezoelectric layer.

7. The generator of claim 5, wherein the first and second electrodes are patterned as a pair of interdigitated electrodes; and wherein the second electrode includes a center finger that is electrically connected to said variable impedance circuit.

8. The generator of claim 7, wherein the first electrode includes a pair of fingers; wherein the center finger extends between the pair of fingers; and wherein a width of the center finger is at least 1.5 times greater than a width of each of the pair of fingers.

9. The generator of claim 7, wherein said resonator further comprises a piezoelectric layer sandwiched between the pair of interdigitated electrodes and the reference electrode.

10. The generator of claim 7, wherein said variable impedance circuit comprises a varactor diode.

11. The generator of claim 10, wherein said variable impedance circuit comprises a fixed capacitor in series between a first terminal of the varactor diode and the second electrode.

12. The generator of claim 11, further comprising a resistor having a first terminal electrically connected to the first terminal of the varactor diode and a second terminal configured to receive a reference voltage.

13. The generator of claim 12, wherein said variable impedance circuit is configured to change a voltage across the varactor diode in response to changes in magnitude of the reference voltage.

14. A periodic signal generator, comprising:
an oscillator circuit configured to generate a periodic signal at an output thereof;
a thin-film piezoelectric-on-semiconductor microelectromechanical resonator having a pair of interdigitated electrodes thereon and a piezoelectric layer sandwiched between the pair of interdigitated electrodes and a reference electrode, said pair of interdigitated electrodes including a first electrode electrically coupled to said oscillator circuit and a second electrode configured as a center finger electrode within the pair;
a variable impedance circuit electrically coupled to the center finger electrode, said variable impedance circuit configured to modify a frequency of the periodic signal by changing an induced electromechanical stiffness in at least a portion of said thin-film piezoelectric-on-semiconductor microelectromechanical resonator; and
an inductor having a first terminal electrically coupled to the second electrode and a second terminal electrically coupled to the reference electrode.

15. The generator of claim 14, wherein an inductance provided by the inductor is sufficient to cancel out at least a majority of a parasitic capacitance of the thin-film piezoelectric layer.

16. A periodic signal generator, comprising:
a thin-film piezoelectric-on-semiconductor resonator comprising a pair of interdigitated electrodes, a reference electrode and a piezoelectric layer extending between the reference electrode and the pair of interdigitated electrodes;
an oscillator circuit configured to generate a periodic signal at an output thereof, said oscillator circuit having a first terminal electrically coupled to a first of the pair of interdigitated electrodes and a second terminal electrically coupled to the reference electrode;
a variable impedance circuit electrically coupled to a second of the pair of interdigitated electrodes, said variable impedance circuit configured to modify an electromechanical stiffness in the piezoelectric layer when said resonator is excited in a fundamental lateral-extensional mode of operation; and
an inductor having a first terminal electrically coupled to the second of the pair of interdigitated electrodes and a second terminal electrically coupled to the reference electrode;
wherein said variable impedance circuit comprises a varactor diode and a fixed capacitor electrically connected in series between a first terminal of the varactor diode and the second of the pair of interdigitated electrodes.

17. The generator of claim 16, wherein said variable impedance circuit is configured to change a voltage across the varactor diode in response to changes in magnitude of a reference voltage.

18. The generator of claim 16, wherein the first of the pair of interdigitated electrodes comprises a pair of electrode fingers and the second of the pair of interdigitated electrodes comprises a single electrode finger extending between the pair of electrode fingers.

19. The generator of claim 18, wherein a width of the single electrode finger is at least 1.5 times greater than a width of each of the pair of electrode fingers.

20. A periodic signal generator, comprising:
an oscillator circuit configured to generate a periodic signal at an output thereof;
a piezoelectric-based microelectromechanical resonator having a plurality of electrodes thereon, including a first electrode electrically coupled to said oscillator circuit;
a variable impedance circuit electrically coupled to a second electrode of said piezoelectric-based microelectromechanical resonator, said variable impedance circuit configured to modify a frequency of the periodic signal by changing an induced electromechanical stiffness in at least a portion of said piezoelectric-based microelectromechanical resonator; and an inductor having a first terminal electrically coupled to the second electrode of said piezoelectric-based microelectromechanical resonator and a second terminal electrically coupled to a reference electrode of piezoelectric-based microelectromechanical resonator.

21. A periodic signal generator, comprising:

a thin-film piezoelectric resonator comprising a pair of interdigitated electrodes, a reference electrode and a piezoelectric layer extending between the reference electrode and the pair of interdigitated electrodes;

an oscillator circuit configured to generate a periodic signal at an output thereof, said oscillator circuit having a first terminal electrically coupled to a first of the pair of interdigitated electrodes and a second terminal electrically coupled to the reference electrode;

a variable impedance circuit electrically coupled to a second of the pair of interdigitated electrodes, said variable impedance circuit configured to modify an electromechanical stiffness in the piezoelectric layer when said resonator is excited in a fundamental lateral-extensional mode of operation; and an inductor having a first terminal electrically coupled to the second of the pair of interdigitated electrodes and a second terminal electrically coupled to the reference electrode.

* * * * *